(12) United States Patent
Ruby et al.

(10) Patent No.: US 7,508,286 B2
(45) Date of Patent: Mar. 24, 2009

(54) HBAR OSCILLATOR AND METHOD OF MANUFACTURE

(75) Inventors: Richard C. Ruby, Menlo Park, CA (US); Wei Pang, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 189 days.

(21) Appl. No.: 11/540,413

(22) Filed: Sep. 28, 2006

(65) Prior Publication Data
US 2008/0079516 A1    Apr. 3, 2008

(51) Int. Cl.
*H03H 9/00* (2006.01)
(52) U.S. Cl. ...................... 333/189; 333/191
(58) Field of Classification Search ................ 333/188, 333/189, 191, 133
See application file for complete search history.

(56) References Cited

U.S. PATENT DOCUMENTS

| | | |
|---|---|---|
| 1,100,196 A | 6/1914 | Pettis |
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,640,756 A | 2/1987 | Wang et al. |
| 4,719,383 A | 1/1988 | Wang et al. |
| 4,798,990 A | 1/1989 | Henoch |
| 4,836,882 A | 6/1989 | Ballato |
| 4,841,429 A | 6/1989 | McClanahan et al. |
| 4,906,840 A | 3/1990 | Zdeblick et al. |

(Continued)

FOREIGN PATENT DOCUMENTS

DE    10160617    6/2003

(Continued)

OTHER PUBLICATIONS

U.S. Appl. No. 10/971,169, filed Oct. 22, 2004, Larson III, John D., et al.

(Continued)

*Primary Examiner*—Jean B Jeanglaude

(57) ABSTRACT

An oscillator comprises a substrate and a high tone bulk acoustic resonator (HBAR), which includes a portion of the substrate. The oscillator also comprises a film bulk acoustic resonator (FBAR) filter disposed over the substrate. The filter comprises a plurality of FBAR devices. The oscillator also comprises a plurality of acoustic isolators disposed in the substrate, wherein one of the isolators is disposed beneath each of the FBAR devices. A method of fabricating an oscillator is also disclosed.

20 Claims, 5 Drawing Sheets

U.S. PATENT DOCUMENTS

| | | |
|---|---|---|
| 5,048,036 A | 9/1991 | Scifres et al. |
| 5,048,038 A | 9/1991 | Brennan et al. |
| 5,075,641 A | 12/1991 | Weber et al. |
| 5,118,982 A | 6/1992 | Inoue et al. |
| 5,129,132 A | 7/1992 | Zdeblick et al. |
| 5,162,691 A | 11/1992 | Mariani et al. |
| 5,233,259 A * | 8/1993 | Krishnaswamy et al. .... 310/324 |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,587,620 A | 12/1996 | Ruby et al. |
| 5,589,858 A | 12/1996 | Kadowaki et al. |
| 5,594,705 A | 1/1997 | Connor et al. |
| 5,671,242 A | 9/1997 | Takiguchi et al. |
| 5,692,279 A | 12/1997 | Mang et al. |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A | 2/1999 | Ylilammi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,982,297 A | 11/1999 | Welle |
| 6,040,962 A | 3/2000 | Kanazawa |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 | 2/2001 | Katakura |
| 6,215,375 B1 | 4/2001 | Larson, III et al. |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Horng |
| 6,307,447 B1 | 10/2001 | Barber et al. |
| 6,307,761 B1 | 10/2001 | Nakagawa |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 | 10/2002 | Horng |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,550,664 B2 | 4/2003 | Bradley et al. |
| 6,564,448 B1 | 5/2003 | Oura et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 * | 1/2005 | Lee ............................. 333/189 |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 * | 9/2005 | Maiz et al. .................. 333/188 |
| 6,946,928 B2 | 9/2005 | Larson et al. |
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |

| | | | |
|---|---|---|---|
| 7,128,941 B2 * | 10/2006 | Lee ............................. 427/58 | |
| 7,170,215 B2 | 1/2007 | Namba et al. | |
| 7,173,504 B2 | 2/2007 | Larson | |
| 7,187,254 B2 | 3/2007 | Su et al. | |
| 7,230,509 B2 | 6/2007 | Stoemmer | |
| 2002/0000646 A1 | 1/2002 | Gooch et al. | |
| 2002/0030424 A1 | 3/2002 | Iwata | |
| 2002/0121944 A1 | 9/2002 | Larson, III et al. | |
| 2002/0121945 A1 | 9/2002 | Ruby et al. | |
| 2002/0152803 A1 | 10/2002 | Larson, III et al. | |
| 2002/0190814 A1 | 12/2002 | Yamada et al. | |
| 2003/0001251 A1 | 1/2003 | Cheever et al. | |
| 2003/0006502 A1 | 1/2003 | Karpman | |
| 2003/0051550 A1 | 3/2003 | Nguyen et al. | |
| 2003/0087469 A1 | 5/2003 | Ma | |
| 2003/0102776 A1 | 6/2003 | Takeda et al. | |
| 2003/0111439 A1 | 6/2003 | Fetter et al. | |
| 2003/0128081 A1 | 7/2003 | Ella et al. | |
| 2003/0132493 A1 | 7/2003 | Kang et al. | |
| 2003/0141946 A1 | 7/2003 | Ruby et al. | |
| 2003/0179053 A1 | 9/2003 | Aigner et al. | |
| 2004/0092234 A1 | 5/2004 | Pohjonen | |
| 2004/0124952 A1 | 7/2004 | Tikka | |
| 2004/0150293 A1 | 8/2004 | Unterberger | |
| 2004/0150296 A1 | 8/2004 | Park et al. | |
| 2004/0195937 A1 | 10/2004 | Matsubara et al. | |
| 2004/0212458 A1 * | 10/2004 | Lee ............................. 333/191 | |
| 2004/0257171 A1 * | 12/2004 | Park et al. .................... 333/133 | |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1 | 3/2005 | Nakatsuka et al. | |
| 2005/0057324 A1 | 3/2005 | Onishi et al. | |
| 2005/0068124 A1 | 3/2005 | Stoemmer | |
| 2005/0093396 A1 | 5/2005 | Larson et al. | |
| 2005/0093653 A1 | 5/2005 | Larson, III | |
| 2005/0093654 A1 | 5/2005 | Larson et al. | |
| 2005/0093655 A1 | 5/2005 | Larson et al. | |
| 2005/0093657 A1 | 5/2005 | Larson et al. | |
| 2005/0093658 A1 | 5/2005 | Larson et al. | |
| 2005/0093659 A1 | 5/2005 | Larson et al. | |
| 2005/0104690 A1 | 5/2005 | Larson | |
| 2005/0110598 A1 | 5/2005 | Larson, III | |
| 2005/0128030 A1 | 6/2005 | Larson et al. | |
| 2005/0140466 A1 | 6/2005 | Larson, III et al. | |
| 2005/0167795 A1 | 8/2005 | Higashi | |
| 2005/0193507 A1 | 9/2005 | Ludwiczak | |
| 2005/0206271 A1 | 9/2005 | Higuchi et al. | |
| 2005/0218488 A1 | 10/2005 | Mie | |
| 2006/0087199 A1 | 4/2006 | Larson et al. | |
| 2006/0103492 A1 | 5/2006 | Feng et al. | |
| 2006/0125489 A1 * | 6/2006 | Feucht et al. ................ 324/633 | |
| 2006/0132262 A1 | 6/2006 | Fazzlo et al. | |
| 2006/0164183 A1 | 7/2006 | Tikka | |
| 2006/0185139 A1 | 8/2006 | Larson, III et al. | |
| 2007/0084964 A1 | 4/2007 | John et al. | |
| 2007/0085447 A1 | 4/2007 | Larson | |
| 2007/0085631 A1 | 4/2007 | Larson et al. | |
| 2007/0085632 A1 | 4/2007 | Larson et al. | |
| 2007/0086080 A1 | 4/2007 | Larson et al. | |
| 2007/0086274 A1 | 4/2007 | Nishimura et al. | |
| 2007/0090976 A1 | 4/2007 | Larson | |
| 2007/0170815 A1 | 7/2007 | Unkrich | |
| 2007/0171002 A1 | 7/2007 | Unkrich | |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528677 | 5/2005 |
| EP | 1557945 | 7/2005 |
| EP | 1575165 | 9/2005 |
| GB | 1207974 | 10/1970 |
| GB | 2411239 | 8/2005 |
| GB | 2418791 | 4/2006 |
| JP | 2002/217676 | 8/2002 |
| WO | WO-98/16957 | 4/1999 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |
| WO | WO-03/018788 | 2/2006 |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002), pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

Hadimioglu, B. et al., ""Polymer Films As Acoustic Matching Layers".", *1990 IEEE Ultrasonics Symposium Proceedings*, vol. 33 PP., [Previously submitted as "Polymer Files As Acoustic Matching Layers, 1990 IEEE Ultrasonics Symposium Proceedings. vol. 4 pp. 1227-1340, Dec. 1990". Considered by Examiner on Mar. 20, 2007,(Dec. 1990),1337-1340.

"Search Report from corresponding application No.", *GB 0605779.8*, (Aug. 23, 2006).

"Examination Report from UK for application", *GB 0605971.1*, (Aug. 24, 2006).

"Examination report corresponding to application No.", *GB06065770.7*, (Aug. 25, 2006).

"Examination Report corresponding to application No.", *GB0605775.6*, (Aug. 30, 2006).

"Search report from corresponding application No.", *GB0620152.9*, (Nov. 15, 2006).

"Search report from corresponding application No.", *GB0620655.1*, (Nov. 17, 2006).

"Search report from corresponding application No.", *GB0620653.6*, (Nov. 17, 2006).

"Search Report from corresponding application No.", *GB0620657.7*, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", *Application No. GB0522393.8*, (Jan. 9, 2006),4 pages.

"A partial copy of GB Search Report for Application No.", *GB0525884.3*, (Feb. 2, 2006),4 pgs.

Auld, B. A., "Acoustic Resonators", *Acoustic Fields and Waves in Solids, Second Edition*, vol. II, (1990),250-259.

"British Search Report Application No.", *0605222.9*, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54 (10)*, (Oct. 1983),5893-5910.

"Search Report from corresponding application", *No. GB0605225.2*, (Jun. 26, 2006).

"Search Report for Great Britain Patent Application", *No. 0617742.2*, (Mar. 29, 2007).

"Search Report for Great Britain Patent Application", *No. 0617742.2*, (Dec. 13, 2006).

"Search Report in the Great Britain Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", Reprinted from *IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0-7803-8331-1/4/W20.00; IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ruby, R. C., "Micro-Machined Thin Film Bulk Acoustic Resonators", *Proc. IEEE 48th, Symposium on Frequency control*, (1994),135-138.

Larson III, J. D., et al., "Measurement of Effective Kt2q,RpRs vs. Temperature for Mo/AlN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Taubbouchi, K. et al., "Zero Temperature coefficient Surface Acoustic Wave Devices using Epitaxial AlN Films", *IEEE Ultrasonic symposium*, San Diaego, CA, 1082, (1982),240-245.

Lakin, K. M., "Thin Film Resonators and Filters", *IEEE Untrasonics Symposium, Caesar's Tahoe*, NV, (Oct. 1999),895-906.

Lakin, K. M., et al., "Temperature Compensated Bulk Acoustic Thin Film Resonators", *IEEE Ultrasonics Symposium, San Juan, Puerto Rico*, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Pang, W. et al., "High Q Single-Mode High-Tone Bulk Acoustic Resonator Integrated With Surface-Machined FBAR Filter", *Microwave Symposium Digest, IEEE MTT-S International*, (2005)413-416.

* cited by examiner

HBAR OSCILLATOR AND METHOD OF MANUFACTURE

BACKGROUND

In many electronic applications, electrical resonators are required. For example, in many wireless communications devices, radio frequency (RF) and microwave frequency resonators are used as voltage controlled oscillators (VCOs). As is known, VCOs are components of phase locked loops (PLLs) and frequency synthesizers used in wireless transceivers, such as mobile telephones.

One type of resonator is a high tone bulk acoustic resonator (HBAR). The HBAR comprises a piezoelectric transducer disposed over a support substrate. In general, the piezoelectric transducer includes a piezoelectric layer disposed between metal electrode layers. The substrate of the HBAR has a thickness that is significantly greater than that of the piezoelectric layer of the transducer. As a result, the HBAR exhibits multiple resonances that are equally spaced, with the spacing being determined by the thickness of the substrate.

The quality (Q) factor of the resonances in the HBAR is proportional to the ratio of the stored energy (longitudinal standing wave) to the lost energy per cycle. Because the thickness of the support substrate of the HBAR is greater than the thickness of the piezoelectric and metal layers of the transducer, most of the acoustic energy of the HBAR is stored in the substrate. Thus, the Q-factor of the HBAR is dominated by acoustic loss (e.g., attenuation) in the substrate.

As will be appreciated from the above description, it is beneficial to include a comparatively low acoustic loss material as the substrate of the HBAR. Unfortunately, many of the materials that exhibit low acoustic loss are often difficult to process in large scale component or circuit fabrication. Moreover, regardless of the material chosen for the substrate, certain processing steps can be deleterious to the HBAR devices and other components during manufacture. In addition, other factors beside acoustic attenuation in the substrate can adversely impact the Q-factor of the HBAR.

What is needed, therefore, is an oscillator and method of fabrication that address at least the shortcomings described above.

SUMMARY

In accordance with an illustrative embodiment, a method of fabricating an oscillator includes providing a substrate and fabricating a high tone bulk acoustic resonator (HBAR), which includes a portion of the substrate. The method also includes fabricating a film bulk acoustic resonator (FBAR) filter over the substrate; and removing a portion of the substrate to provide a desired substrate thickness.

In accordance with another illustrative embodiment, an oscillator includes a substrate; a high tone bulk acoustic resonator (HBAR), which includes a portion of the substrate; and a film bulk acoustic resonator (FBAR) filter disposed over the substrate, wherein the filter comprises a plurality of FBAR devices. In representative embodiments, the oscillator also includes a plurality of acoustic isolators disposed in the substrate wherein one of the isolators is disposed beneath each of the FBAR devices.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of apparati, devices, materials and methods known to one of ordinary skill in the art may be omitted so as to not obscure the description of the example embodiments. Such apparati, devices, methods and materials are clearly within the scope of the present teachings.

Figure 1:
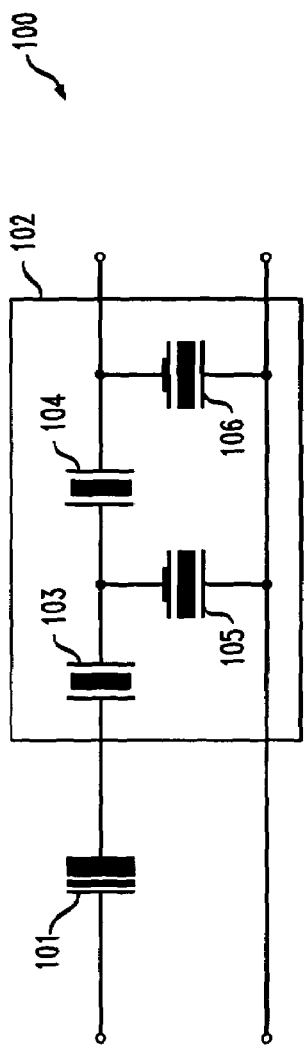
FIG. 1 is a simplified block diagram of an oscillator in accordance with an illustrative embodiment.

FIG. 1 is a simplified block diagram of an oscillator 100 in accordance with an illustrative embodiment. The oscillator 100 may be used in one of a variety of applications. For example, the oscillator 100 may be used in a voltage controlled oscillator (VCO) prevalent in many components of communications devices such as phase-locked loops (PLLs) and frequency synthesizers. Of course, this is merely illustrative and other applications within the purview of one of ordinary skill in the art are contemplated. In addition, while oscillators of the representative embodiments are adapted to function at specified frequencies for wireless communications (e.g., GHz operating frequencies), the specified frequencies are in no way limiting of the scope of the present teachings.

The oscillator 100 includes an HBAR 101 with an output to an FBAR filter 102. As described more fully herein, the HBAR 101 includes a support substrate and a piezoelectric transducer disposed thereover. The output of the HBAR 101 comprises a plurality of harmonics. The filter 102 is adapted to pass or 'pick' off a harmonic at the desired oscillator operating frequency.

FBAR filter 102 comprises a plurality of FBARs. In the representative embodiment shown, FBAR filter 102 is a ladder filter having series FBARs 103, 104, shunt FBAR 105 and a tuning FBAR 106. In certain embodiments, FBAR filter 102 may be a single stage FBAR filter, while in other embodiments FBAR filter 102 may be a multi-stage FBAR filter. As FBAR-based filter topologies are known to those skilled in the art, details are generally omitted in order to avoid obscuring the description of the representative embodiments. For example, additional details of the oscillator 100 may be found in "High-Tone Bulk Acoustic Resonator Integrated with Surface Micromachined FBAR Filter on a Single Substrate" to Wei Pang, et al. (Transducers '05, IEEE International Conference on Solid-State Sensors and Actuators (Seoul, Korea), Jun. 5-9, 2005, vol. 2, pp. 2057-2060.) The disclosure of this document is specifically incorporated herein by reference.

Figure 2:
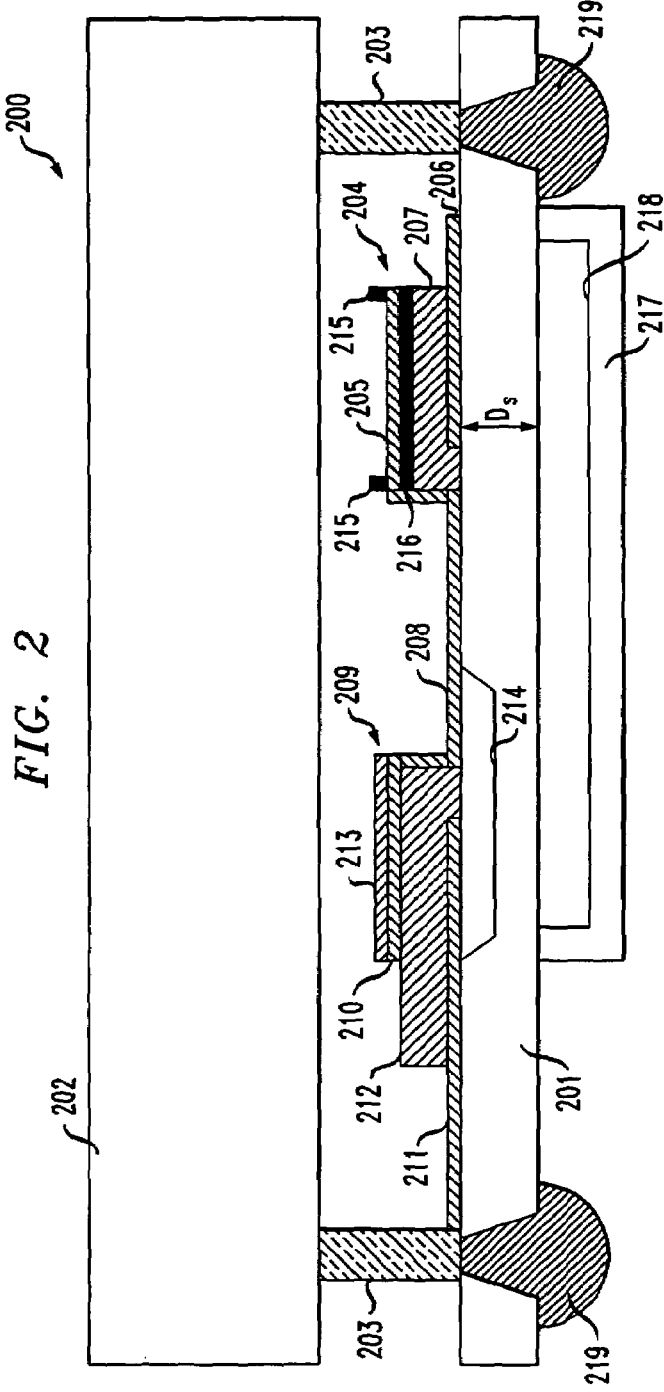
FIG. 2 is a cross-sectional view of an oscillator including an HBAR resonator and an FBAR device in accordance with an illustrative embodiment.

FIG. 2 is a cross-sectional view of an oscillator 200 in accordance with an illustrative embodiment. The oscillator 200 may be used as the oscillator 100 described above. The oscillator 200 comprises a substrate 201 and a cap substrate 202. As described more fully herein, the substrate 201 is selected to provide acceptable acoustic attenuation and to be adaptable to processing.

The cap substrate 202 is attached to the substrate 201 by a gasket 203. Collectively, the cap substrate 202 and gasket 203 may be referred to as a microcap structure, or simply microcap. Further details of microcap structures may be found in U.S. Pat. Nos. 6,265,246; 6,376,280; 6,777,267 all to Ruby, et al.; and U.S. Pat. No. 6,777,263, to Gan, et al. The referenced patents are assigned to the present assignee and are specifically incorporated herein by reference. As will become clearer as the present description continues, the cap substrate 202 and gasket 203 of the microcap structure combine to provide hermeticity and mechanical robustness to components of the oscillator 200.

In certain embodiments, the cap substrate 202 may include electronic components, or integrated circuits, or both, that provide one or more of a variety of functions. For example, the cap substrate 202 may be a semiconductor (e.g., silicon) substrate having complementary metal oxide semiconductor (CMOS) circuits. Illustratively, the noted circuits and components may support the oscillator 200, or combine with the oscillator 200 to provide a component, such as a VCO or a PLL.

An HBAR 204 comprises a support substrate provided by a portion of the substrate 201; and a tri-layer comprising a top electrode 205, a bottom electrode 206 and a piezoelectric layer 207. The electrodes 205, 206 is illustratively Molybdenum (Mo) or other suitable electrode material; and the piezoelectric layer 207 is illustratively AlN or ZnO.

As described more fully herein, the substrate 201 has a thickness '$D_s$' selected to provide a suitable Q-factor and to provide a desired fundamental acoustic mode and thus, harmonic mode spacing. Representative materials for the substrate 201 include single-crystal silicon, crystalline quartz, fused silica and sapphire. Certain details about HBAR devices may be found in "High-Tone Bulk Acoustic Resonators on Sapphire, Crystal Quartz, Fused Silica and Silicon Substrates" to Wei Pang, et al. (Journal of Applied Physics 99, 124911 (June 2006)), the disclosure of which is specifically incorporated herein by reference.

The HBAR 204 is connected to an FBAR 209 by metallization 208 as shown. While only one FBAR 209 is shown in the present view, there is a plurality of FBARs disposed over the substrate 201 and connected to one another to form an FBAR filter, such as FBAR filter 102 of FIG. 1. The FBAR 209 includes a top electrode 210, a bottom electrode 211 and a piezoelectric layer 212. Furthermore, an optional mass loading layer 213 is provided over the top electrode 210. The mass loading of the top electrode 210 may be as described in U.S. Pat. No. 6,617,249, to Ruby, et al. and assigned to the present assignees. The electrodes 210, 211 may be Molybdenum (Mo) or other suitable electrode material; and the piezoelectric layer 212 is illustratively AlN or ZnO.

The bottom electrode 211 is disposed over a cavity 214 formed in the substrate 201 and may extend partially or completely over the cavity 214. As is known, the cavity 214 provides acoustic isolation to the FBAR 209 and thus increases the Q factor of the FBAR 209 by reducing acoustic losses. Further details of the cavity 214 and its fabrication may be found in U.S. Pat. No. 6,384,697 entitled "Cavity Spanning Bottom Electrode of Substrate Mounted Bulk Wave Acoustic Resonator" to Ruby, et al. and assigned to the present assignee. The disclosure of this patent is specifically incorporated herein by reference.

Alternatively, acoustic mirrors, such as Bragg mirrors (not shown) may be provided in the substrate 101 and beneath the FBAR 209 to provide acoustic isolation, resulting in a solid-mounted resonator (SMR). Acoustic mirrors and their fabrication are known to those of ordinary skill in the art. For example, commonly assigned U.S. Patent Publication 20050110597 to Larson, et al. describes acoustic mirrors. The disclosure of this publication is specifically incorporated herein by reference.

The HBAR 204 may also include a frame structure 215 to improve the Q-factor. The frame structure 215 is useful in reducing spurious (lateral) modes that adversely impact the Q-factor. In general, the frame structure 215 is an annulus corresponding to the perimeter of the active area, which is defined as the overlap area of the top electrode 205 and the bottom electrode 206. While the frame structure 215 shown in FIG. 2 is a raised frame structure, in representative embodiments, the frame structure may be either a raised frame structure or a recessed frame structure.

The selection of a raised or recessed frame structure depends on a variety of factors and desired results. In representative embodiments, a raised or recessed frame structure may be selected to improve the Q-factor of the HBAR 204 in general. Moreover, the raised or recessed frame structure may be selected to improve aspects of the Q-factors in selected portions of the Q-circle as desired. Further details of frame structures, their fabrication and their use may be found in U.S. Pat. No. 6,812,619 to Kaitila, et al.; and in commonly assigned U.S. Patent Applications to Feng, et al. and having Ser. Nos. 10/990,201 and 10/867,540. The disclosures of this patent and patent applications are specifically incorporated herein by reference.

Furthermore, the HBAR 204 may comprise one or more temperature compensation elements 216. These elements are useful in substantially maintaining the frequency response of the HBAR 204 over a temperature range. In an illustrative embodiment, the temperature compensating element 216 may comprise a layer of boron doped silicon oxide. This material has a temperature coefficient of frequency (TCF) of approximately +400.0 ppm/° C. and is useful in compensating for the impact of the temperature on the AlN piezoelectric layer and silicon substrate, which have a TCF of −30.0 ppm/° C. and −30.0 ppm/° C., respectively. It is emphasized that the use of boron doped oxide is merely illustrative and that the use of other temperature compensated materials is contemplated. Further details of temperature compensating layers may be found in commonly assigned U.S. patent application Ser. No. 10/977,398 to John D. Larson, III. The disclosure of this application is specifically incorporated herein by reference.

The oscillator 200 may include a protective structure 217 disposed beneath the substrate 201 and at least beneath the HBAR 204. In representative embodiments, the protective structure 217 is made of commercially available materials such as a material commercially available from MicroChem Corporation of Newton, Mass. USA and sold under the tradename SU8; benzocyclobutene (BCB); polyimide; or other suitable material. The material SU-8 is described in U.S. Pat. No. 4,882,245, the disclosure of which is specifically incorporated by reference herein.

The protective structure 217 includes a recess 218 (or void) that comprises air or other material that will not impact the acoustic properties of the HBAR 204. Beneficially, the protective structure 217 prevents debris, moisture and other matter from collecting on the lower surface of the substrate 201. As will be appreciated, the collection of such matter on the substrate may cause a shift in the frequency response of the HBAR 204 and other deleterious affects.

Electrical connections to the components of the oscillator 200 may be made through plated vias 219 in the substrate 201. The vias 219 may be plated or substantially filled with a conductor such as gold. These vias 219 usefully provide a suitable surface for wirebonds (not shown) and similar connections.

In representative embodiments, the substrate thickness, $D_s$, is substantially larger than the thickness of the piezoelectric layer 207. For example, the substrate 201 may have a thickness in the range of approximately 10.0 μm to approximately 50.0 μm, and the piezoelectric material may have a thickness of approximately 1.0 μm to 2.0 μm. Because the electromechanical coupling coefficient, $k_t^2$, is proportional to the ratio of the electric energy density in a particular volume to the acoustic energy in a particular volume, the coupling coefficient can be comparatively degraded by providing a relatively thick support substrate for the HBAR 204. Moreover, the product $k_t^2 Q$ is approximately constant. Thus, by degrading $k_t^2$, Q can be improved.

It is emphasized that the noted approximation is impacted by energy loss in the substrate 201 due to unrecovered acoustic energy, which degrades the Q factor. For example, if the substrate thickness, $D_s$, is too large, the coupling coefficient, $k_t^2$, is unacceptably small and the acoustic losses in the substrate 201 are also unacceptably large. Thus, in accordance with the present teachings, the substrate thickness, $D_s$, is selected to suitably degrade the coupling coefficient, $k_t^2$, and to provide acceptable acoustic losses therein, in order to provide an improved Q-factor in the HBAR 204. To this end, in an illustrative embodiment, using single crystal silicon for the substrate with $D_s$ in the range noted above, the Q-factor of the HBAR 204 is in the range of approximately 5,000 to approximately 10,000.

The substrate thickness, $D_s$, is also selected to provide a desired fundamental mode and thus mode spacing. It can be shown that the resonance frequency of the $N^{th}$ order mode of the HBAR 207 is given by:

$$fr \approx \frac{N}{2 \cdot [(Dp/Vp) + (Ds/Vs)]}$$

where: N is the mode number; $D_p$ is the thickness of the piezoelectric layer 207; $V_p$ is the velocity of sound in the piezoelectric layer 207; $D_s$ is the thickness of the substrate 201; and $V_s$ is the velocity of sound in the substrate 201.

As will be appreciated from the above relation, the greater the thickness of the substrate ($D_s$), the lower the frequency of the fundamental acoustic mode and the greater the number of modes supported by the HBAR 204. It follows that the greater the number of supported modes, the higher the acoustic losses, which is not desirable. However, the thinner the substrate, the higher the frequency of the fundamental mode and the smaller the inter-mode spacing. As such, selecting a desired mode through filtering is more challenging. Thus, the thickness, $D_s$, is selected to reduce the number of modes supported in the HBAR and to provide a desired fundamental frequency and inter-mode spacing.

Figure 3:
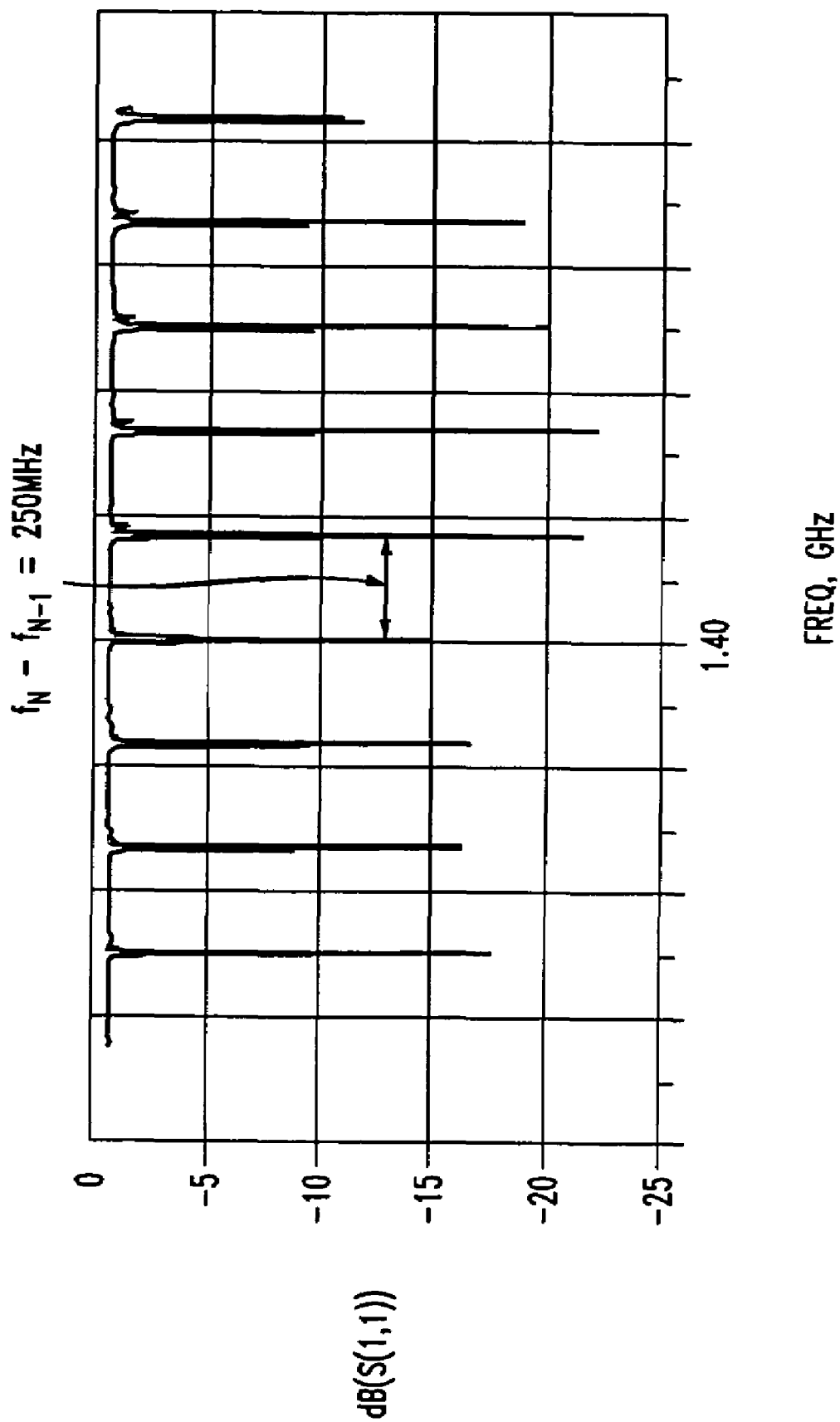
FIG. 3 is a graph of the input reflection coefficient (S11) of an HBAR versus frequency in accordance with an illustrative embodiment.

FIG. 3 is a graphical representation of the input reflection coefficient (S11) of an HBAR versus frequency in accordance with an illustrative embodiment. The selected frequency range is of interest in many wireless communications systems and devices. In the representative embodiment, the HBAR 204 includes a single crystal silicon substrate having a thickness of approximately 20 μm and an AlN piezoelectric layer having a thickness of approximately 1.0 μm. This provides a fundamental acoustic mode having a frequency of approximately 250 MHz and thus an inter-mode spacing of approximately 250 MHz.

In accordance with the present teachings, a desired mode having a desired frequency for operation in a selected system/device can be passed through a filter (e.g., FBAR filter 102) having a comparatively large passband. Beneficially, the filter requirements are not as stringent as is required of other known oscillators. To this end, in certain embodiments the bandwidth of the filter may be approximately one-half (or less) of the intermode spacing as determined by thickness of HBAR substrate. In the present representative embodiment the substrate has a thickness of approximately 20 μm, which provides an intermode spacing of approximately 250 MHz, the bandwidth of the filter may be approximately 125 MHz (or less). Moreover, filters according to the certain embodiments usefully provide an insertion loss of approximately 3 dB or less and a rejection of approximately 25 dB or greater. As will be appreciated by one of ordinary skill in the art, such characteristics greatly facilitate low power consumption oscillator design.

FIGS. 4A-4F are cross-sectional views illustrating a method of fabricating an oscillator including an HBAR and FBAR filter in accordance with a representative embodiment. Generally, the methods used in the fabrication sequence of FIG. 4A-4F are known to those skilled in the art. Many of these methods are described in the referenced patents, patent applications and papers. As such, many details of the methods used are omitted.

Figure 4A:
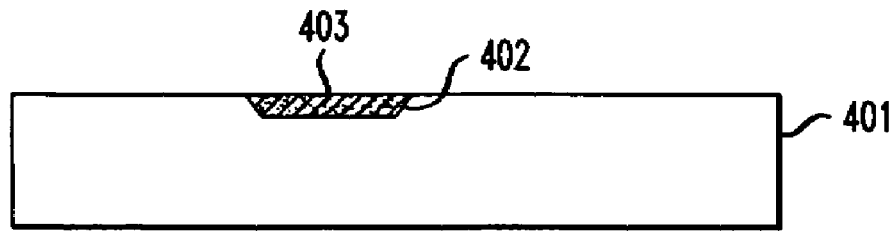
FIGS. 4A-4F are cross-sectional views illustrating a method of fabricating an oscillator in accordance with an illustrative embodiment.

In FIG. 4A, a substrate 401 is provided. In the present embodiment, the substrate 401 is single crystal silicon, but may be one of the materials noted above. A recess 402 is etched into the substrate 401 to a depth of approximately 3.0 μm using a known dry or wet etching technique. For example, a reactive ion etching (RIE) step may be used to provide the recess 402. This may be a deep RIE (DRIE) such as by the known Bosch process. Next a sacrificial layer 403 is provided in the recess. The sacrificial layer 403 may be one of a variety of materials known to those skilled in the art. In a representative embodiment, the sacrificial layer 403 is phosphor-silica-glass. The sacrificial layer 403 is deposited and subsequently polished to provide a suitable surface for subsequent processing.

Figure 4B:
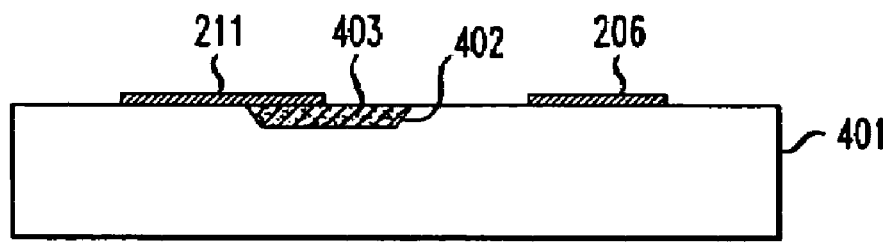
Figure 4C:
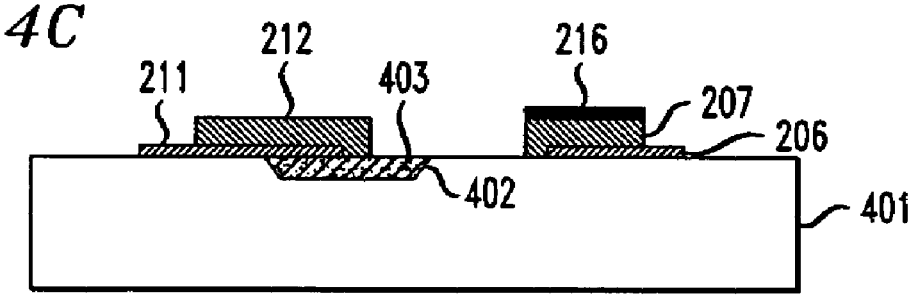

As shown in FIG. 4B, bottom electrodes 206, 211 are deposited by known technique. FIG. 4C shows the deposition of the piezoelectric layers 207, 212 of the HBAR 204 and FBAR 209, respectively. In this step, the optional temperature compensating element 216 may be deposited.

Figure 4D:
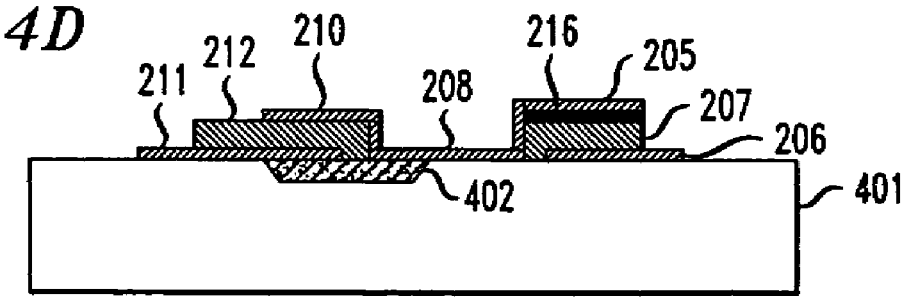
Figure 4E:
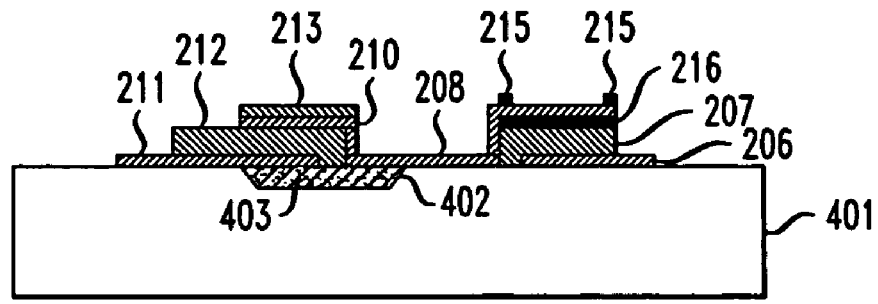

FIG. 4D shows the deposition of top electrodes 205, 210 and metallization 208. FIG. 4E shows the formation of the optional mass loading layer 213 and the optional (raised) frame structure 215. Illustratively, mass loading layer 213 and the frame structure are made of materials and fabricated by methods disclosed in referenced patent application Ser. Nos. 10/990,201 and 10/867,540 and U.S. Pat. No. 6,617,249. Moreover, the formation of a recessed frame structure 215 may be carried out by methods described in the referenced patent to Kaitila, et al.

Figure 4F:
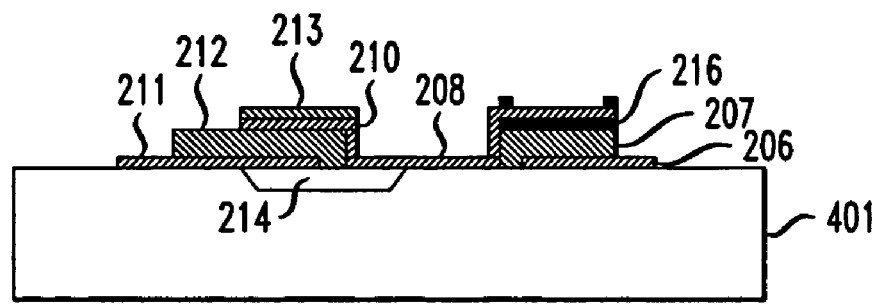

Finally, FIG. 4F shows the removal of the sacrificial layer 403 from the recess 402 to provide the cavity 214. The layer 403 may be removed providing release holes and etching with a wet-etch solution as described in U.S. Pat. No. 6,384,697.

FIGS. 5A-5D are cross-sectional views illustrating a method of fabricating an oscillator in accordance with an illustrative embodiment. As will be appreciated, the method described completes the oscillator structure begun in FIG. 4A.

Figure 5A:
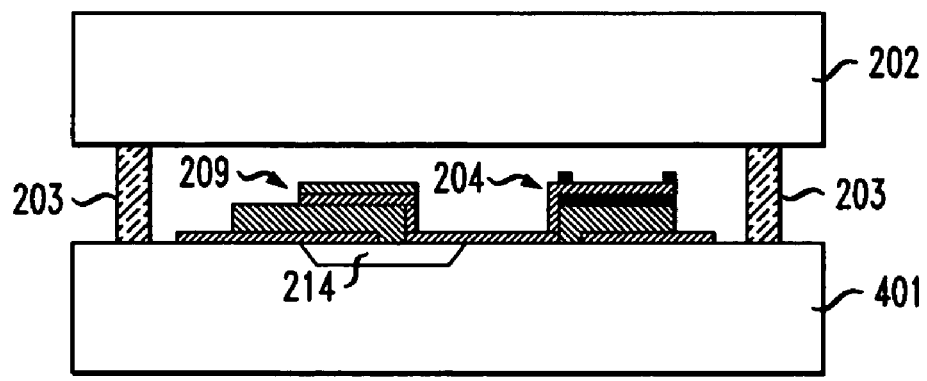
FIGS. 5A-5D are cross-sectional views illustrating a method of fabricating an oscillator in accordance with an illustrative embodiment.

FIG. 5A shows the formation of the microcap structure by providing the cap substrate 202 over the substrate 201 with the gasket 203 therebetween. Details of methods for fabricating a microcap structure including a cap substrate and a gasket may be found in U.S. Pat. Nos. 6,265,246; 6,376,280; 6,777,267 all to Ruby, et al.; and U.S. Pat. No. 6,777,263, to Gan, et al., referenced previously.

After the microcap structure is disposed over the substrate 401, the components disposed over the substrate 401 are substantially hermetically sealed. Thus, the HBAR 204, the FBAR 209 and other components are protected from subsequent processing described herein. Moreover, the microcap structure provides mechanical support to the oscillator during the subsequent fabrication and handling.

Figure 5B:
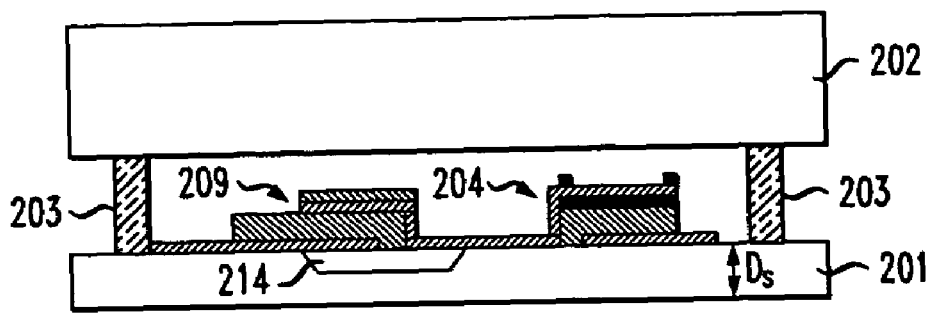

FIG. 5B shows the substrate 201 of thickness, $D_s$, formed by grinding and polishing substrate 401. The first step in thinning the substrate 401 comprises a coarse grinding step using a diamond grinder or similar device. After completion of the coarse grinding step, a polishing step is carried out to provide an acceptably smooth lower surface to the substrate 201. The polishing step may be carried out by a known method, such as chemical mechanical polishing (CMP). This step is useful in reducing surface defects caused by the coarse grinding step. Accordingly, the polishing step reduces acoustic energy loss of acoustic waves in the substrate that can result from such surface defects. Beneficially, this prevents degradation of the Q-factor of the HBAR due to such losses.

As noted previously, the substrate 201 may be silicon, which, in a representative embodiment has a thickness, $D_s$, of approximately 10.0 µm to approximately 50.0 µm. In an embodiment in which the final thickness of the substrate is approximately 20.0 µm, the coarse grinding step may be used to remove the substrate 401 to a thickness of approximately 21 µm to approximately 22 µm. Thereafter, the fine polish step by CMP is used to remove the last 1 µm to 2 µm of the substrate and to provide the substrate 201 with an acceptably smooth lower surface. In accordance with a representative embodiment, CMP provides a surface roughness as low as approximately 0.5 nm to approximately 1.0 nm.

Figure 5C:
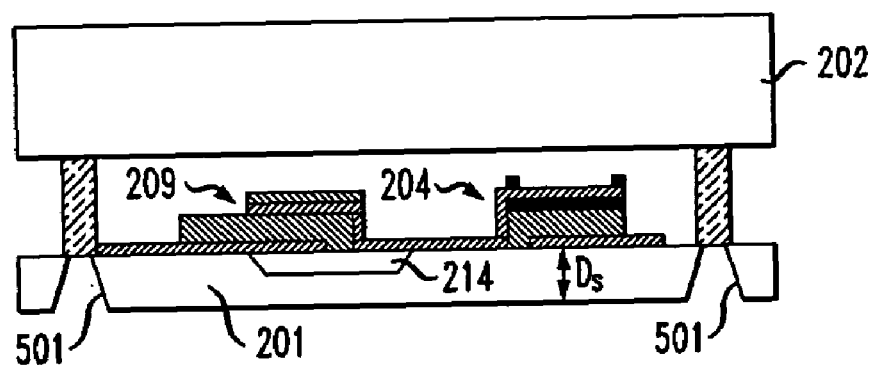
Figure 5D:
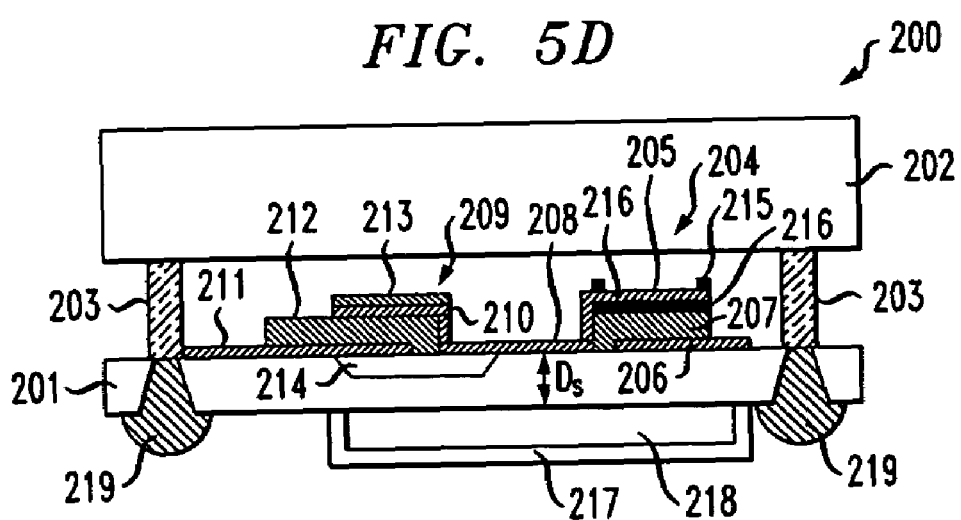

As shown in FIG. 5C, after the substrate 201 is formed to its desired thickness, vias 501 are etched. These vias 501 may be etched using a dry-etching technique such as DRIE or other known micromachining technique. After the vias 501 are etched, a suitable material is plated therein to form the plated vias 219, as shown in FIG. 5D. Notably, the plated vias 219 are adapted to connect to wirebonds (not shown) for connecting the oscillator 200 to other circuitry (also not shown).

After the vias 219 are fabricated, the protective structure 217 is provided over the lower surface of the substrate 201, and over at least the HBAR 205. Upon formation of the protective structure, the oscillator 200 is essentially completed.

The protective structure 217 may be formed by a known method in which a layer of material (e.g., SU-8) is provided over a sacrificial substrate (not shown). The sacrificial substrate is then selectively etched to provide the protective structure 217. The protective structure 217 may then be adhered to the substrate.

In an alternative embodiment, the protective structure may be fabricated over a transfer substrate (not shown), provided over the lower surface of the substrate 201, and adhered thereto. The forming of the protective structure 217 using a transfer substrate may be effected according to the teachings of commonly assigned U.S. patent application Ser. No. 11/540,412, to Frank Geefay, and entitled "PROTECTIVE STRUCTURES AND METHODS OF FABRICATING PROTECTIVE STRUCTURES OVER WAFERS." This application is being filed concurrently and the disclosure of this application is specifically incorporated herein by reference.

In connection with illustrative embodiments, an oscillator and methods of fabricating the oscillator are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of fabricating an oscillator, the method comprising:
   providing a substrate;
   fabricating a high tone bulk acoustic resonator (HBAR), wherein the HBAR includes a portion of the substrate;
   fabricating a film bulk acoustic resonator (FBAR) filter over the substrate; and
   removing a portion of the substrate to provide a desired substrate thickness.

2. A method as claimed in claim 1, wherein the removing further comprises:
   grinding the substrate to a first thickness; and
   polishing the substrate to the desired thickness.

3. A method as claimed in claim 1, wherein fabricating the HBAR further comprises forming a raised frame structure over an active area of the HBAR.

4. A method as claimed in claim 1, wherein fabricating the HBAR further comprises forming a recessed frame structure over an active area of the HBAR.

5. A method as claimed in claim 1, wherein fabricating the FBAR filter further comprises:
   fabricating a plurality of cavities in the substrate; and
   fabricating an FBAR structure over each of the cavities.

6. A method as claimed in claim 1, wherein fabricating the FBAR filter further comprises:
   fabricating a plurality of acoustic isolators in the substrate; and
   fabricating an FBAR structure over each of the acoustic isolators.

7. A method as claimed in claim 6, wherein the acoustic isolators are Bragg mirrors.

8. A method as claimed in claim 1, further comprising:
   providing a temperature compensating element over a piezoelectric layer of the HBAR.

9. A method as claimed in claim 1, further comprising:
   forming a microcap structure over the HBAR and the FBAR filter, the microcap structure adapted to provide hermeticity to the HBAR and the FBAR filter.

10. A method as claimed in claim 1, further comprising:
    providing a protective structure beneath the substrate and at least in a region beneath the HBAR.

11. A method as claimed in claim 10, further comprising an air gap between the protective structure and the substrate.

12. A method as claimed in claim 1, wherein the substrate is silicon and the desired thickness is in the range of approximately 10.0 μm to approximately 50.0 μm.

13. An oscillator, comprising:
   a substrate;
   a high tone bulk acoustic resonator (HBAR), which includes a portion of the substrate;
   a film bulk acoustic resonator (FBAR) filter disposed over the substrate, wherein the filter comprises a plurality of FBAR devices; and
   a plurality of acoustic isolators disposed in the substrate, wherein one of the isolators is disposed beneath each of the FBAR devices.

14. An oscillator as claimed in claim 13, further comprising:
   a frame structure disposed over a top electrode of the HBAR, wherein the frame structure is adapted to suppress spurious modes in the HBAR.

15. An oscillator as claimed in claim 13, wherein the substrate has a thickness selected to provide a desired harmonic mode frequency spacing.

16. An oscillator as claimed in claim 14, wherein the filter is adapted to pass a selected one of a plurality of harmonic modes.

17. An oscillator as claimed in claim 13, further comprising:
   a microcap structure over the HBAR and the FBAR filter, the microcap structure being adapted to provide hermeticity to the HBAR and the FBAR filter.

18. An oscillator as claimed in claim 13, wherein the HBAR further comprises a temperature compensating element.

19. An oscillator as claimed in claim 13, further comprising a protective structure disposed beneath the substrate and at least in a region beneath the HBAR.

20. An oscillator as claimed in claim 14, wherein the frame structure is one of:
   a raised frame structure or a recessed frame structure.

* * * * *